United States Patent [19]
Fu-Kang et al.

[11] Patent Number: 6,030,509
[45] Date of Patent: Feb. 29, 2000

[54] APPARATUS AND METHOD FOR SHIELDING A WAFER HOLDER

[75] Inventors: Tien Fu-Kang, Hsing-Chu; Li Hung-Yeh, Hsin-Chu, both of Taiwan

[73] Assignee: Taiwan Semiconductor Manufacturing Co., Ltd, Hsin-Chu, Taiwan

[21] Appl. No.: 09/055,540

[22] Filed: Apr. 6, 1998

[51] Int. Cl.[7] .................................................. C23C 14/34
[52] U.S. Cl. ............................ 204/192.12; 204/298.11; 204/298.09; 118/504; 118/725
[58] Field of Search ...................... 204/192.12, 298.09, 204/298.11; 118/504, 725

[56] References Cited

U.S. PATENT DOCUMENTS

| | | | |
|---|---|---|---|
| 5,096,536 | 3/1992 | Cathey, Jr. ............................. | 156/643 |
| 5,725,740 | 3/1998 | Raaijmakers ....................... | 204/192.12 |
| 5,736,021 | 4/1998 | Ding et al. ......................... | 204/298.11 |
| 5,810,931 | 9/1998 | Stevens et al. ........................ | 118/721 |
| 5,843,520 | 12/1998 | Liu .......................................... | 427/124 |
| 5,873,983 | 2/1999 | Liu ...................................... | 204/192.15 |

*Primary Examiner*—Nam Nguyen
*Assistant Examiner*—Steven H. VerSteeg
*Attorney, Agent, or Firm*—Tung & Associates

[57] ABSTRACT

The present invention provides a wafer holder shield in a physical vapor deposition chamber for use in a metal deposition process without the arcing problem. The shield is constructed in a configuration of a toroid wherein the toroid has a rectangular cross-section and a flat bottom surface. The toroid further has a cavity at the center adapted for receiving a wafer when the shield is placed on a wafer holder. The flat bottom surface of the wafer holder shield has an inner end adjacent to an inner periphery of the toroid that is supported by the wafer holder. The flat bottom surface further has an outer end adjacent to an outer periphery of the toroid suspended over and spaced apart from a chamber shield for the deposition chamber at a distance sufficient to prevent bridge formation between the wafer holder shield and the chamber shield by metal particles generated in the deposition chamber.

13 Claims, 1 Drawing Sheet

APPARATUS AND METHOD FOR SHIELDING A WAFER HOLDER

FIELD OF THE INVENTION

The present invention generally relates to an apparatus and method for depositing a metal layer on an electronic substrate in a physical vapor deposition process and more particularly, relates to an apparatus and method for shielding a wafer holder in a physical vapor deposition chamber by providing a wafer holder shield positioned on a wafer holder that does not allow bridge formation and subsequent arcing between the wafer holder shield and a chamber shield in the physical vapor deposition chamber.

BACKGROUND OF THE INVENTION

In the fabrication of semiconductor devices, a frequently used fabrication technique involves the deposition of a metallic layer on the surface of a wafer. The deposition process applies a thin metal coating to cover a surface area including vias or contact holes that have diameters in the sub-micron range. The metal deposition process is essential for achieving a precise pattern alignment and reliability in fabricating VLSI and ULSI devices. A typical physical vapor deposition apparatus that is used to deposit metal films on wafer surfaces is discussed below. One of such typical apparatus, i.e., an ULVAC®-3000 sputtering apparatus 10 is shown in FIG. 1. Into the sputtering apparatus 10, a wafer 12 is first placed inside a vacuum chamber 14 constructed by top wall 16, sidewalls 18 and bottom wall 22. The wafer 12 is positioned on a wafer holder 20. The wafer holder 20 is usually constructed by a stainless steel body 24, a quartz top 26 and a heating apparatus 32. The quartz top 26 has a top surface 36 for supporting the wafer 12 thereon. The wafer holder 20 is normally supported on the bottom wall 22 of the vacuum chamber 14 by insulating means 42. The vacuum chamber 14 is further equipped with a sputtering gas inlet port 28 which is connected to a gas supply 30 of a sputtering gas such as argon or other inert gases. The sputtering gas is normally flown into vacuum chamber 14 at a flow rate between 1 sccm and 300 sccm. A second gas inlet 44 is provided to allow a purge gas to be flown into the chamber 14. A gas outlet port 46 in chamber 14 is connected to an evacuation pump (not shown) for maintaining a pressure within the chamber 14 at approximately $10^{-3}$ m Torr during a metal deposition process.

A metal target 50 of a suitable metallic material such as aluminum or titanium is mounted to the top wall 16 of chamber 14 and is electrically insulated from the grounded walls 16 by insulators 38. The target 50 is electrically connected to the negative terminal of a power supply 40 which has an adjustable power level. The chamber 14 further includes a cylindrical chamber shield 52 which has an upper extension 54 adjacent to the edges of the metal target 50 and a bottom extension 56 which overlaps a bottom edge of a wafer holder shield 60. The wafer holder shield 60 is constructed of a metallic material in a toroidal shape wherein the toroid has a rectangular cross-section with an extended lip section 62. A detailed enlarged view of the wafer holder shield 60 is shown in FIG. 1A.

The heater 32 housed in the wafer holder 20 includes an electrical resistance heater that is connected to a power supply (not shown). The heater 32 is used to initially heat wafer 12 at the beginning of a sputtering process. A gas source is normally used to supply a circulating gas in the wafer holder 20 in order to uniformly heat the wafer 12. The wafer 12 may also be electrically biased with respect to the grounded chamber through the wafer holder 20 by a biasing power supply (not shown).

In the physical vapor deposition chamber 10, after a wafer 12 is first positioned on the top surface 36 of the quartz top 26 of the wafer holder 20, the wafer holder shield 60 is positioned on the top surface 36 with a center cavity 68 to accommodate the wafer 12. The extended lip 62 of the wafer holder shield 60 overlaps the edge 64 of the wafer holder 20 to protect the lower chamber cavity 66 from metal particles 90 ejected from target 50 during a deposition process. Such contamination of the lower chamber cavity 66 by metal particles 90 is most undesirable since frequently cleaning of the cavity 66 requires substantial down time. The sealing of the lower chamber cavity 66 is also achieved by the overlap between the extended lip 62 of the wafer holder shield 60 and the extended flange 56 of the chamber shield 52. This arrangement is also shown in FIG. 1B in a detailed cross-sectional view of the wafer holder 20 and the wafer holder shield 60.

As shown in FIG. 1B, the distance x between the extended lip portion 62 of the wafer holder shield 60 and the lower extended flange 56 of the chamber shield 52 is approximately 2 mm in a conventional sputtering apparatus such as the ULVAC®-3000. It should be noted that, to simplify for illustration purpose, the quartz top 26 and the heater 32 are not shown in FIG. 1B.

One serious drawback of the conventional set-up shown in FIG. 1B is the potential of metal particles build up in the gap x between the lip portion 62 of the wafer holder shield 60 and the lower extended flange 56 of the chamber shield 52. After a large number of depositions have been conducted in the physical vapor deposition chamber 10, metal particles accumulates in the gap x. Since the wafer 12 (FIG. 1) the wafer holder shield 60 and the chamber shield 52 must be insulated from each other, metal particles built up in the gap causes a serious problem of arcing. It has been observed that, when the gap is narrowed to approximately 1 mm, arcing phenomenon starts to occur. When arcing occurs, a metal film layer of unstable thickness and poor uniformity is formed. In a severe arcing situation, the circuits formed on the wafer can be damaged and causing a scrap of the wafer.

The arcing problem is most severe since it cannot be predicted or pre-detected by resistance measurements prior to the operation of a sputtering apparatus. Even when the gap is narrowed to approximately 1 mm, no short is detected by a resistance measurement. However, after a deposition process is started by withdrawing vacuum in the chamber, i.e., to a rough vacuum of approximately $10^{-3}$ m Torr, arcing problem occurs at such narrow gap.

It is therefore an object of the present invention to provide a wafer holder shield in a sputtering chamber for use in a metal deposition process that does not have the drawbacks and shortcomings of the conventional wafer holder shields.

It is a further object of the present invention to provide a wafer holder shield in a sputtering apparatus wherein a larger, minimum gap between the wafer holder shield and a chamber shield is maintained.

It is a further object of the present invention to provide a wafer holder shield in a sputtering apparatus wherein the shield is kept away from a chamber shield at a distance of at least 2.5 mm such that arcing does not occur between the wafer holder shield and the chamber shield.

It is another further object of the present invention to provide a wafer holder shield for a sputtering apparatus wherein a newly designed shield without an extended lip portion is used to ensure a larger gap is maintained between the wafer holder shield and the chamber shield.

It is still another object of the present invention to provide a wafer holder shield in a sputtering apparatus wherein the shield is further equipped with locating pins for easy positioning on a wafer holder.

It is yet another object of the present invention to provide a wafer holder shield in a sputtering apparatus wherein the shield can be securely mounted onto the top of a wafer holder and does not move upon vibration of the sputtering apparatus.

It Is still another further object of the present invention to provide a method for shielding a wafer holder in a sputtering apparatus without the occurrence of arcing by utilizing a wafer holder shield that can be maintained at a larger distance from a chamber shield such that metal particles deposited in the gap does not cause arcing.

It is yet another further object of the present invention to provide a method for shielding a wafer holder in a sputtering apparatus without the occurrence of arcing by providing the wafer holder shield with locating pins such that the shield can be easily positioned on a wafer holder and securely mounted such that it does not move upon vibration of the sputtering apparatus.

SUMMARY OF THE INVENTION

In accordance with the present invention, a wafer holder shield in a sputtering chamber for use in a metal deposition process that does not have the drawbacks and the shortcomings of a conventional wafer holder shield is provided.

In a preferred embodiment, a shield for a wafer holder situated in a metal deposition chamber is provided which includes a shield body that has a configuration of a toroid and a cavity at the center adapted for receiving a wafer when the body is placed on a wafer holder, the toroid has a rectangular cross-section and a flat bottom surface, the flat bottom surface further has an inner end adjacent to an inner periphery of the toroid being supported by the wafer holder and an outer end adjacent to an outer periphery of the body being suspended over and spaced apart from a chamber shield of the deposition chamber at a distance sufficient to prevent a bridge formation between the shield body and the chamber shield by metal particles generated in the deposition chamber. The wafer holder shield is normally constructed of a metallic material, such as stainless steel. The metal deposition chamber is a physical vapor deposition chamber or a sputtering chamber. The outer end of the flat bottom surface is spaced apart from the chamber shield at a distance of not less than 2.5 mm. The shield may further include locating means in the shield body adapted for engaging receiving means in the wafer holder. The locating means are at least two pins while the receiving means are at least two apertures in the wafer holder.

In another preferred embodiment, a physical vapor deposition chamber for depositing metal particles on an electronic substrate is provided which includes a chamber body that has a cavity defined by chamber walls, a metal target mounted to a top chamber wall in the cavity, a substrate holder for holding an electronic substrate on top, the holder has a surface area larger than the substrate, a chamber shield for shielding the chamber walls from being covered by particles emitted from the target during a deposition process, and a substrate holder shield that has a body of a toroid and a rectangular cross-section, the body is positioned on the substrate holder such that an inner periphery of the substrate holder shield is supported by an outer peripheral portion of the substrate holder shielding the outer peripheral portion of the substrate holder from metal particles during a deposition process and an outer periphery of the substrate holder shield being suspended over and spaced apart from the chamber shield at a sufficient distance such that the formation of a bridge between the substrate holder shield and the chamber shield by metal particles from the target is substantially prevented during a deposition process. The electronic substrate used in the physical vapor deposition chamber is a semiconductor wafer. The chamber shield is generally of a cylindrical shape such that a surface of the target is only exposed to surfaces of the electronic substrate and the substrate holder shield. The outer periphery of the substrate holder shield is suspended over an inner periphery of the chamber shield at a distance of at least 2.5 mm. The substrate holder may further include a heater means for heating the substrate during the metal deposition process.

The present invention is further directed to a method for shielding a wafer holder without the occurrence of arcing problem which can be carried out by the operating steps of providing a sputter chamber that has a cavity defined by chamber walls, mounting a metal target to a top chamber wall in the cavity, positioning a wafer holder that has a top surface area larger than the wafer, mounting a chamber shield for shielding the chamber walls from metal particles generated by the target during a deposition process, and positioning a wafer holder shield that has a body of a toroidal shape and a flat bottom surface wherein the toroid defining an aperture therein adapted for receiving a wafer such that an inner peripheral edge of the flat bottom surface of the toroid is in intimate contact with and being supported by the wafer holder while an outer peripheral edge of the flat bottom surface of the toroid is suspended over and spaced apart from the chamber shield at a sufficient distance such that bridge formation by metal particles during a deposition process between the wafer shield and the chamber shield and subsequent arcing are avoided. The method may further include the steps of forming a negative pressure in the chamber, and dislodging metal particles from the target and depositing on a top surface of the wafer. The chamber shield is used to shield all surfaces in the sputter chamber except that of the target, the wafer and the wafer holder shield. The aperture defined by the toroid has an inner diameter sufficiently large for receiving an outer diameter of the wafer. The method may further include the step of maintaining a distance of at least 2.5 mm between the outer peripheral edge of the wafer shield and the chamber shield for preventing bridge formation by the metal particles between the two parts. The distance maintained between the outer peripheral edge of the wafer shield and the chamber shield may preferably be 3.5 mm. The method may further include the step of withdrawing air from the cavity of the sputtering chamber to a negative pressure of not higher than $10^{-2}$ m Torr. The wafer holder may optionally be equipped with a heater means for heating the wafer, and insulating means for the wafer holder for insulating against the chamber walls.

BRIEF DESCRIPTION OF THE DRAWINGS

These and other objects, features and advantages of the present invention will become apparent from the following detailed description and the appended drawings in which.

DETAILED DESCRIPTION OF THE PREFERRED EMBODIMENT

Figure 1:
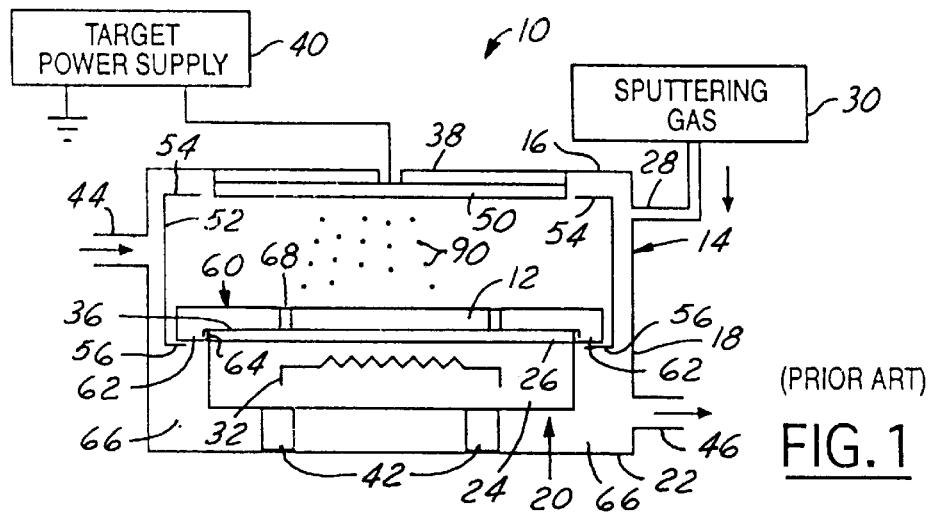
FIG. 1 is a cross-sectional view of a conventional sputtering apparatus having a wafer holder shield positioned on top of a wafer holder.
Figure 1A:
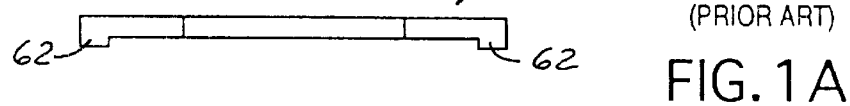
FIG. 1A is an enlarged, cross-sectional view of the wafer holder shield shown in FIG. 1.
Figure 1B:
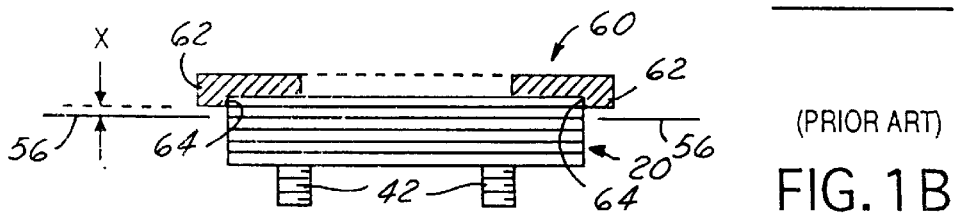
FIG. 1B is an enlarged, cross-sectional view of the conventional wafer holder shield positioned on a wafer holder.

The present invention discloses a shield for a wafer holder situated in a metal deposition chamber that is capable of maintaining a minimum distance from a chamber shield such that metal particles deposited in a gap between the wafer holder shield and the chamber shield does not lead to arcing problem on the wafer positioned on the wafer holder.

In a physical vapor deposition chamber or a sputtering chamber, a wafer is generally positioned on a wafer holder while the uncovered portion of the wafer holder is shielded from metal particles by a wafer holder shield. The wafer, the wafer holder and the wafer holder shield are at the same voltage potential since they are in contact with each other. A chamber shield which is used to shield surfaces of the chamber walls such that metal particles do not contaminate the chamber walls and the lower cavity of the chamber must be insulated against the wafer holder shield. When such insulation is not maintained due to deposited metal particles in a gap between the chamber shield and the wafer holder shield, arcing problem occurs such that the wafer can be severely damaged leading to the scrap of the wafer and/or to the down time of the deposition chamber. Under normal usage, the chamber shield is stripped off the coated metal particles and reused several times before the shield becomes distorted and must be replaced. Metal particles can be stripped off the chamber shield by a wet cleaning process, followed by sand blasting and water rinsing.

The wafer holder shield is normally manufactured of a metallic material such as stainless steel, and therefore cannot touch or electrically communication with a chamber shield. The wafer holder shield must overlap a portion, i.e., a inner flange of the chamber shield such that metal particles are prevented from escaping into a lower chamber cavity and thus contaminating the cavity. The functions of a wafer holder shield is therefore not only preventing metal particles from entering a lower chamber cavity, but also ensuring the wafer holder shield sits securely on top of the wafer holder even under vibrating conditions of the deposition chamber.

The present invention novel wafer holder shield therefore has two important novel features, namely, a flat bottom is provided on the wafer holder shield such that a minimum distance is maintained between the wafer holder shield and the chamber shield, and furthermore, at least two locating pins are provided on the bottom side of the wafer holder shield such that the pins engage cavities in the wafer holder for locating and securely mounting the wafer holder shield.

It has been discovered that, a minimal distance of 2.5 mm should be maintained between the wafer holder shield and the chamber shield such that arcing can be prevented. The minimum distance would allow some deposition of metal particles in the gap maintained between the two parts. A preferred minimum distance is approximately 3.5 mm. The present invention novel wafer holder shield prevents the deposition of unstable metal film and non-uniform metal films formed in the sputtering chamber. The novel wafer holder shield therefore prevents unnecessary scrap of wafers due to arcing damage and reduces machine down time due to replacement of such wafer holder shield. As a result, the preventive maintenance period is substantially extended to at least double its normal period. It has been noticed that, unlike in the conventional practice of replacing the wafer holder shield each time the metal target is replaced, the wafer holder shield lasts through several cycles of metal target replacement. The lifetime of the shield is thus extended at least four to five times of its normal lifetime in a conventionally designed wafer holder shield by reclaiming the shield after cleaning.

Figure 2:
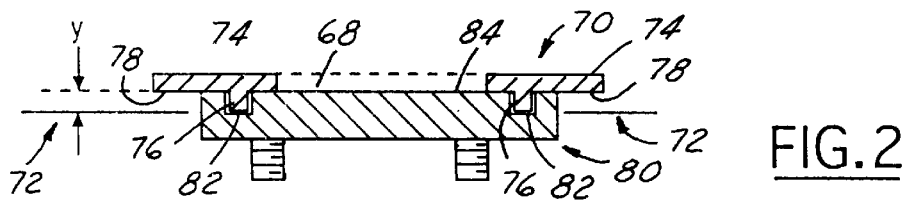
FIG. 2 is an enlarged, cross-sectional view of the present invention wafer holder shield positioned on top of a wafer holder.
Figure 2A:
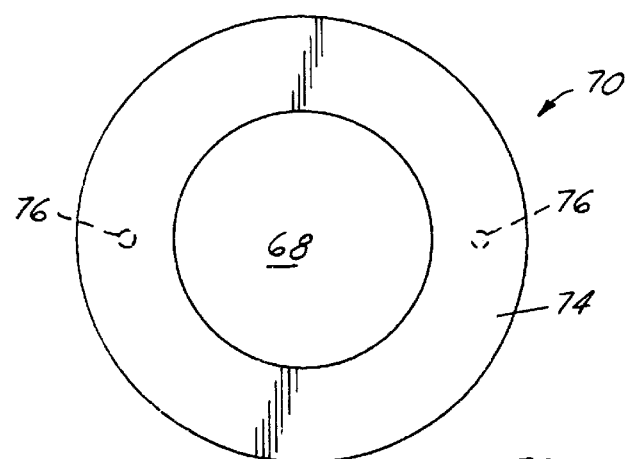
FIG. 2A is a plane view of a present invention wafer holder shield.
Figure 2B:
FIG. 2B is an enlarged, cross-sectional view of the present invention wafer holder shield equipped with two locating pins.

Referring initially to FIG. 2, wherein a present invention wafer holder shield 70 is shown. The wafer holder shield 70 is mounted, on top of a wafer holder 80 and spaced apart from a chamber shield 72. The wafer holder shield 70 is constructed of a metallic material such as stainless steel which is resistant to most hostile sputtering environment. The wafer holder shield 70 is also shown in FIG. 2A in a plane view, and in FIG. 2B in an enlarged cross-sectional view.

The wafer holder shield 70 is constructed in a toroidal configuration with a cross-section 74 of the toroid in a rectangular shape. The wafer holder shield 70 is equipped with at least two locating pins 76 mounted to the bottom surface 78 of the shield. The locating pins 76 are positioned on the bottom surface 78 in such a way that they are adapted for engaging cavities 82 provided in a top surface 84 of the wafer holder 80.

The locating pins 76 provide two major functions. First, they enable the easy mounting and locating of the wafer holder shield 70 to the wafer holder 80. Secondly, they provide means for securely mounting the wafer holder shield 70 to the wafer holder 80 without movement even when the sputtering chamber may be under a vibrational condition. This is essential to ensure that the top surface 84 of the wafer holder 80 is securely covered and to allow a wafer (not shown) to be securely mounted in the cavity 68 of the toroid. It should be noted that, instead of the two locating pins 76 illustrated in the preferred embodiment of the present invention, any other suitable number of locating pins can be utilized to securely mount the wafer holder shield 70 to the wafer holder 80 as long as a corresponding number of cavities 82 are provided in the surface of the holder.

A minimum distance, as shown by y in FIG. 2, of about 2.5 mm and preferably of about 3.5 mm should be maintained between the bottom surface 78 of the wafer holder shield 70 and the lower flange 72 of the chamber shield.

The present invention further discloses a method for shielding a wafer holder in a physical vapor deposition chamber without the occurrence of arcing that can be carried out by the following steps. First, a sputter chamber that has a chamber cavity defined by chamber walls is provided. A metal target is then mounted to a top chamber wall in the cavity. A wafer holder which has a top surface area larger than a wafer is then positioned in the chamber cavity. A chamber shield is also mounted for shielding the chamber walls from metal particles generated by the metal target during a deposition process. A wafer holder shield is finally positioned on the wafer holder which has a body of toroidal shape and a flat bottom surface. The toroid defining an aperture for receiving a wafer such that an inner peripheral edge of the flat bottom surface of the toroid is in intimate contact with and supported by the wafer holder. An outer peripheral edge of the flat bottom surface of the toroid is suspended over and spaced apart from the chamber shield at a sufficient distance such that bridge formation by metal particles during a deposition process between the wafer shield and the chamber shield and subsequent arcing can be avoided.

While the present invention has been described in an illustrative manner, it should be understood that the terminology used is intended to be in a nature of words of description rather than of limitation.

Furthermore, while the present invention has been described in terms of a preferred embodiment, it is to be appreciated that those skilled in the art will readily apply these teachings to other possible variations of the inventions.

The embodiment of the invention in which an exclusive property or privilege is claimed are defined as follows:

1. A shield for a wafer holder situated in a metal deposition chamber comprising:

a shield body having a configuration of a toroid, a cavity at the center adapted for receiving a wafer when said body is placed on a wafer holder and a locating means in said shield body adapted for engaging receiving means in said wafer holder, said toroid having a rectangular cross-section and a flat bottom surface, said flat bottom surface further comprising an inner end adjacent to an inner periphery of said toroid being supported by said wafer holder and an outer end adjacent to an outer periphery of said toroid being suspended over and spaced apart from a chamber shield for said deposition chamber at a distance sufficient to prevent a bridge formation between said shield body and said chamber shield by metal particles generated in said deposition chamber.

2. A shield for a wafer holder situated in a metal deposition chamber according to claim 1, wherein said locating means are at least two pins while said receiving means are at least two apertures for receiving said pins.

3. A shield for a wafer holder situated in a metal deposition chamber according to claim 1, wherein said shield is made of metal.

4. A shield for a wafer holder situated in a metal deposition chamber according to claim 1, wherein said metal deposition chamber is a physical vapor deposition chamber or a sputtering chamber.

5. A shield for a wafer holder situated in a metal deposition chamber according to claim 1, wherein said outer end of said flat bottom surface being spaced apart from said chamber shield at a distance of not less than 2.5 mm.

6. A method for shielding a wafer holder without the occurrence of arcing comprising the steps of:

providing a sputter chamber having a cavity defined by chamber walls, mounting a metal target to a top chamber wall in said cavity, positioning a wafer holder having a top surface area larger than a wafer, mounting a chamber shield for shielding said chamber walls from metal particles ejected by said target during a deposition process, and positioning a wafer holder shield having a body of a toroidal shape and a flat bottom surface on the wafer holder wherein said toroid defining an aperture having a diameter larger than an outer diameter of said wafer adapted for receiving a wafer such that an inner peripheral edge of said flat bottom surface of said toroid being in intimate contact with and being supported by said wafer holder while an outer peripheral edge of said flat bottom surface of said toroid being suspended over and spaced apart from said chamber shield at a sufficient distance such that bridge formation by metal particles during a deposition process between said wafer holder shield and said chamber shield and subsequent arcing are avoided.

7. A method for shielding a wafer holder without the occurrence of arcing according to claim 6 further comprising the steps of:

forming a negative pressure in said chamber, and dislodging metal particles from said target and depositing on a top surface of said wafer.

8. A method for shielding a wafer holder without the occurrence of arcing according to claim 6 further comprising the step of shielding all surface in said sputter chamber except that of the target, the wafer and the wafer holder shield with a chamber shield.

9. A method for shielding a wafer holder without the occurrence of arcing according to claim 6 further comprising the step of maintaining a distance of at least 2.5 mm between said outer peripheral edge of the wafer holder shield and said chamber shield for preventing bridge formation by metal particles between said two components.

10. A method for shielding a wafer holder without the occurrence of arcing according to claim 6 further comprising the step of maintaining a distance of at least 3.5 mm between said outer peripheral edge of the wafer holder shield and said chamber shield for preventing bridge formation by metal particles between said two parts.

11. A method for shielding a wafer holder without the occurrence of arcing according to claim 6 further comprising the step of withdrawing air from the cavity of the sputter chamber to a negative pressure of not higher than $10^{-2}$ m Torr.

12. A method for shielding a wafer holder without the occurrence of arcing according to claim 6 further comprising the step of equipping said wafer holder with a heater means.

13. A method for shielding a wafer holder without the occurrence of arcing according to claim 6 further comprising the step of providing insulating means between said wafer holder and said chamber walls.

* * * * *